(12) United States Patent
Chuang et al.

(10) Patent No.: US 11,262,506 B1
(45) Date of Patent: Mar. 1, 2022

(54) RECESSED PORTION IN A SUBSTRATE AND METHOD OF FORMING THE SAME

(71) Applicant: Advanced Semiconductor Engineering, Inc., Kaohsiung (TW)

(72) Inventors: Shao Hsuan Chuang, Kaohsiung (TW); Huang-Hsien Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/988,325

(22) Filed: Aug. 7, 2020

(51) Int. Cl.
*G02B 6/36* (2006.01)
*H01L 21/3065* (2006.01)
*G02B 6/42* (2006.01)

(52) U.S. Cl.
CPC ......... *G02B 6/3636* (2013.01); *G02B 6/3632* (2013.01); *G02B 6/4243* (2013.01); *H01L 21/30655* (2013.01); *G02B 6/3608* (2013.01)

(58) Field of Classification Search
None
See application file for complete search history.

(56) References Cited

U.S. PATENT DOCUMENTS

| | | | |
|---|---|---|---|
| 6,531,068 B2 | 3/2003 | Laermer et al. | |
| 6,841,486 B2 * | 1/2005 | Boudreau | G02B 6/4228 385/51 |
| 2002/0069497 A1 * | 6/2002 | Musk | G02B 6/3636 29/25.01 |
| 2003/0202768 A1 * | 10/2003 | Nasiri | G02B 6/3833 385/137 |
| 2004/0097077 A1 * | 5/2004 | Nallan | B81C 1/00619 438/689 |
| 2006/0098050 A1 * | 5/2006 | Terui | B41J 2/1626 347/61 |
| 2006/0292877 A1 * | 12/2006 | Lake | H01L 23/481 438/694 |
| 2009/0275202 A1 * | 11/2009 | Tanaka | H01L 21/3065 438/700 |
| 2011/0006284 A1 * | 1/2011 | Cho | G02B 1/005 257/14 |
| 2011/0201205 A1 * | 8/2011 | Sirajuddin | H01L 21/3086 438/702 |
| 2011/0268384 A1 * | 11/2011 | Akkaya | G02B 6/262 385/12 |
| 2012/0092771 A1 * | 4/2012 | Liu | H01L 21/30 359/576 |

(Continued)

*Primary Examiner* — Michael Stahl

(74) *Attorney, Agent, or Firm* — Foley & Lardner LLP

(57) ABSTRACT

A recessed portion in a semiconductor substrate and a method of forming the same are provided. The method comprises: forming a mask on the semiconductor substrate; forming a protection layer on a top surface of the mask and on at least one sidewall of the mask, and on at least one surface of the semiconductor substrate exposed by the mask; performing a first etching process to remove the protection layer on the top surface of the mask and on a bottom surface of the semiconductor substrate exposed by the mask; and performing a second etching process to remove the remaining protection layer and to etch the semiconductor substrate to form the recessed portion. In this way, a recessed portion with relatively smooth and vertical sidewalls can be realized.

8 Claims, 12 Drawing Sheets

(56) References Cited

U.S. PATENT DOCUMENTS

| | | | |
|---|---|---|---|
| 2012/0202347 A1* | 8/2012 | Ready | H01L 23/147 438/666 |
| 2013/0328173 A1* | 12/2013 | Fuller | H01L 21/76898 257/622 |
| 2013/0330034 A1* | 12/2013 | Feng | H01L 31/105 385/14 |
| 2016/0091667 A1* | 3/2016 | Nishizawa | G02B 6/3652 385/14 |
| 2017/0316976 A1* | 11/2017 | Koppitsch | H01L 21/30655 |
| 2020/0057201 A1* | 2/2020 | Chang | G02B 6/4257 |

* cited by examiner

RECESSED PORTION IN A SUBSTRATE AND METHOD OF FORMING THE SAME

BACKGROUND

1. Technical Field

The present disclosure relates to a semiconductor structure including a recessed portion, and more particularly, to a recessed portion in a semiconductor substrate formed by a method using etching techniques.

2. Description of the Related Art

In the semiconductor industry, deep recesses such as deep holes or trenches in semiconductor substrates are widely used and fabricated. However, the sidewalls of the deep holes or trenches are usually rough and inclined. Therefore, it would be desirable to provide an improved fabricating method so as to form deep holes or trenches with desired shapes and profiles.

SUMMARY

In an aspect, a method of forming a recessed portion in a substrate is provided. The method comprises: (a) forming a mask on the substrate; (b) forming a protection layer on at least one sidewall of the mask, and on at least one surface of substrate exposed by the mask; (c) performing a first etching process to remove the protection layer on the at least one surface of the substrate exposed by the mask; and (d) performing a second etching process to remove the protection layer on the at least one sidewall of the mask and to etch the substrate to form the recessed portion.

In an aspect, a structure in a semiconductor substrate is provided. The structure comprises: a recessed portion in the semiconductor substrate, the recessed portion including at least one sidewall and a bottom surface, in which the at least one sidewall comprises a profile including a plurality of concaves, and the concaves have substantially uniform shapes and sizes along the at least one sidewall.

In an aspect, a structure in a semiconductor substrate is provided. The structure comprises: a recessed portion including at least one sidewall and a bottom surface, in which the at least one sidewall is substantially perpendicular to the bottom surface, and a vertical depth of the recessed portion is within a range of about 160 nm to 400 nm.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Figure 1A:
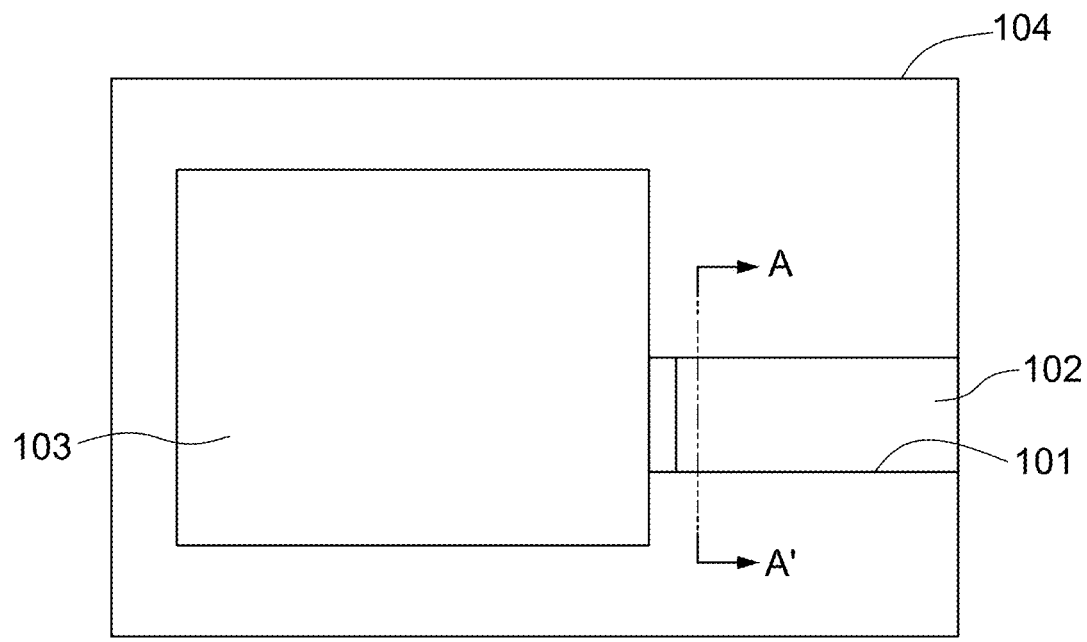
FIG. 1A illustrates a schematic top view of an exemplified optical electronic device.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "top," "bottom," "higher," "lower," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of embodiments of this disclosure are not deviated by such arrangement. As used herein, the singular terms "a," "an," and "the" may include plural referents unless the context clearly dictates otherwise.

In the field of optical communication, an optical fiber is often used as a medium for transmitting a light wave. In an optical electronic device, for example a photonic integrated circuit (PIC), a recessed portion such as a trench is often designed and fabricated in a semiconductor device so that the fiber can be accommodated therein. The optical fiber may be coupled with a waveguide. In this way, light can be transmitted through the fiber coupled with the waveguide. In practice, a fiber array unit (FAU), which includes a plurality of optical fibers, is usually utilized to transmit light with different wavelengths in a band of wave.

FIG. 1A illustrates a schematic top view of an exemplified optical electronic device. In FIG. 1A, a trench 101, a fiber array unit (FAU) 102, the first die 103, and the second die 104 are shown. As shown in FIG. 1, the FAU 102 is disposed in a trench 101 located in the second die 104, and the FAU 102 transmits the light received from a waveguide. However, in some circumstances, the shape and profile of the trench may not be desirable.

Figure 1B:
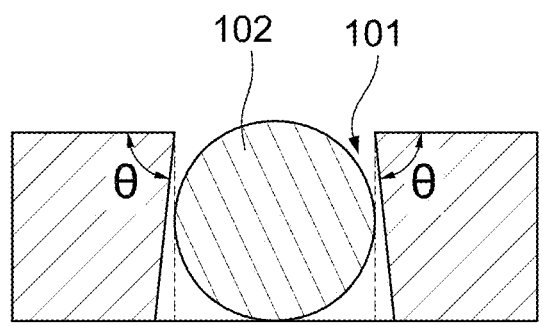
FIG. 1B illustrates a cross-sectional view of a trench and a fiber in the exemplified optical electronic device.

FIG. 1B illustrates a cross-sectional view of the trench 101 and the FAU 102 in the exemplified optical electronic device shown in FIG. 1A. The cross-sectional view of the trench 101 and FAU 102 is from A to A' in FIG. 1A. The trench 101 in FIG. 1B is fabricated through a process according to an embodiment. As shown in FIG. 1B, the sidewalls of the trench 101 are not perpendicular to the bottom surface of the trench 101. As shown in FIG. 1B, the angles between the sidewalls and the top surface are denoted as θ, which may be about 82 degrees and are obviously much less than 90 degrees. When a FAU 102 is disposed in a trench with such a trapezoid cross-section, the FAU can shift in the trench, which may cause undesirable loss of signal transmission.

FIGS. 2A-2E each illustrates a cross-sectional view of a structure under fabrication using a method according to an embodiment, in which the method is used for fabricating a recessed portion. FIG. 2F illustrates a cross-sectional view of a completed structure according to an embodiment. It should be noted that these figure are not drawn to scale; instead, they are drawn for ease of illustration and explanation.

Figure 2A:
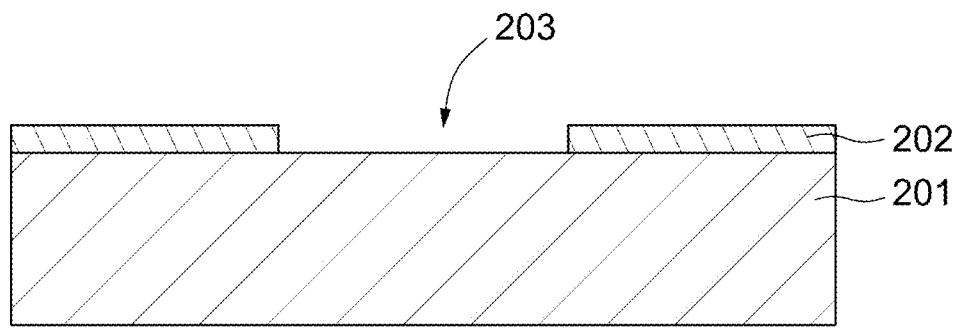
FIGS. 2A-2E each illustrate a cross-sectional view of a structure under fabrication using a method according to an embodiment.
Figure 2B:
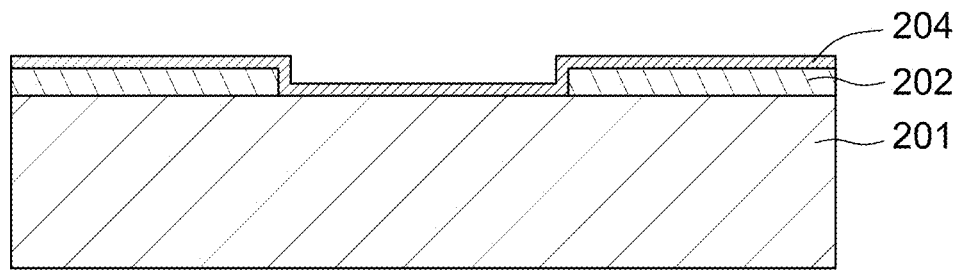
Figure 2C:
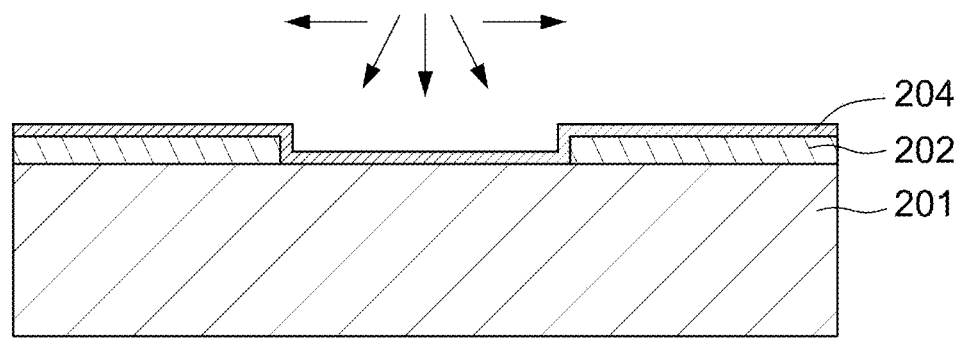
Figure 2D:
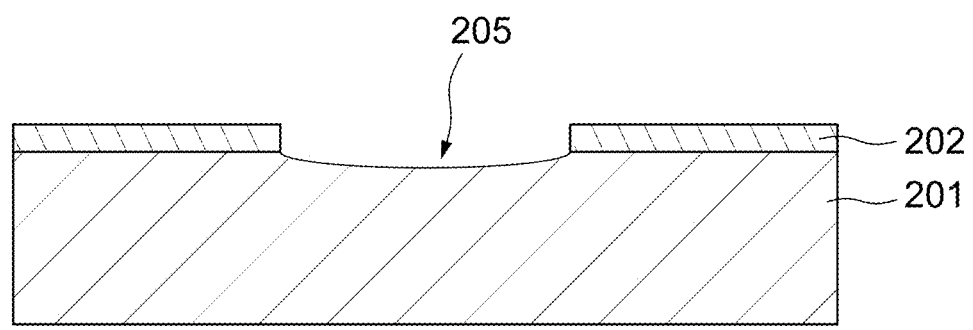
Figure 2E:
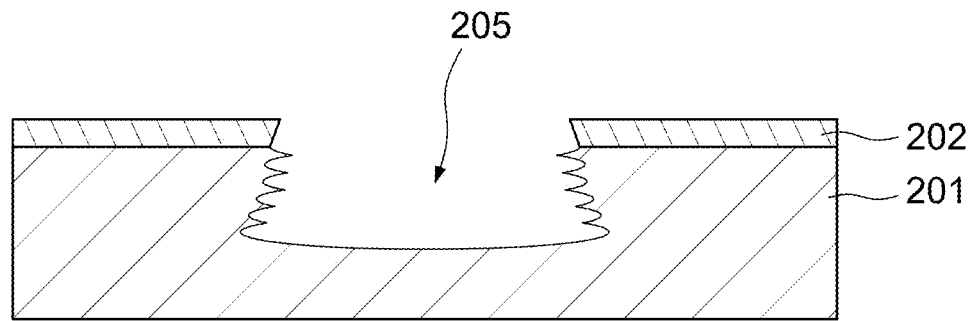
Figure 2F:
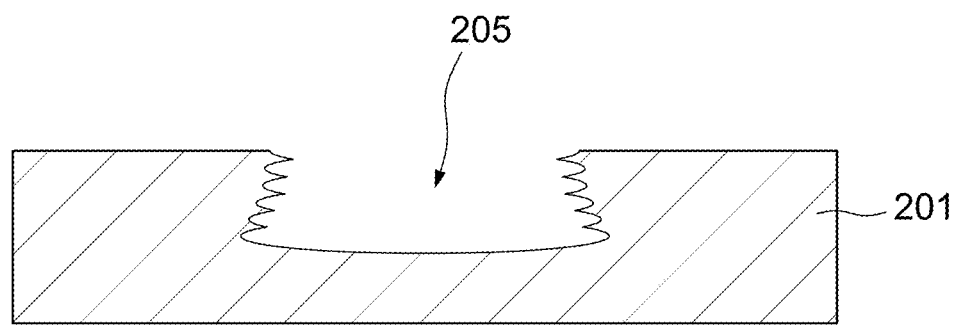
FIG. 2F illustrates a cross-sectional view of a completed structure according to an embodiment.

In FIG. 2A, a semiconductor substrate 201 is provided. A mask 202 is formed by, for example, a photolithography technique, and which defines an opening so that a part of the semiconductor substrate 201 is exposed to form an exposed region 203. In FIG. 2B, a protection layer 204 is formed so as to cover the mask 202 and the exposed region 203. In FIG. 2C, an etching process is performed. Note that in the embodiment, the etching process utilizes isotropic etching, so the etching is performed uniformly in every direction as shown by the arrows in FIG. 2C. The etching process removes the protection layer 204 and thus exposes a portion of the substrate, and also etches the exposed substrate to form a recessed portion 205 in the semiconductor substrate 201, as shown in FIG. 2D. By repeating the above-mentioned steps of forming a protection layer and performing an etching process, the recessed portion 205 is getting deeper and wider, as shown in FIG. 2E. As shown in FIG. 2F, after removing the mask 202, the complete recessed portion 205 is obtained and the fabricating process is complete. Note that because the isotropic etching needs to be continuously performed after the protection layer 204 being etched so as to further etch the substrate, the mask 204 may also be partially etched by the repeated isotropic etching processes. As can be seen in FIG. 2E, due to the directions of etching (as shown by the arrows in FIG. 2C), after repeated etching processes, the mask is etched so that the opening of the mask 204 becomes wider and the sidewall of the mask becomes outwardly inclined. This may cause the opening of the etched recessed portion undesirably larger and thus cause the etched recessed portion becomes wider and wider during the repeated etching processes and finally becomes a taper shape. As can be seen in FIG. 2F, the complete recessed portion 205 has a trapezoid cross-section. An FAU can shift in the recessed portion when it is disposed in such a recessed portion, which may cause undesirable loss of signal transmission.

It should be noted that while FIGS. 2A-2F show the cross-sectional views, the type of the recessed portion can be determined by the shape of the opening of the mask. For example, if the opening of the mask is in a rectangular shape, then the recessed portion would be a trench. On the other hand, if the opening of the mask is in a circular shape, then the recessed portion would be a circular hole.

Figure 3A:
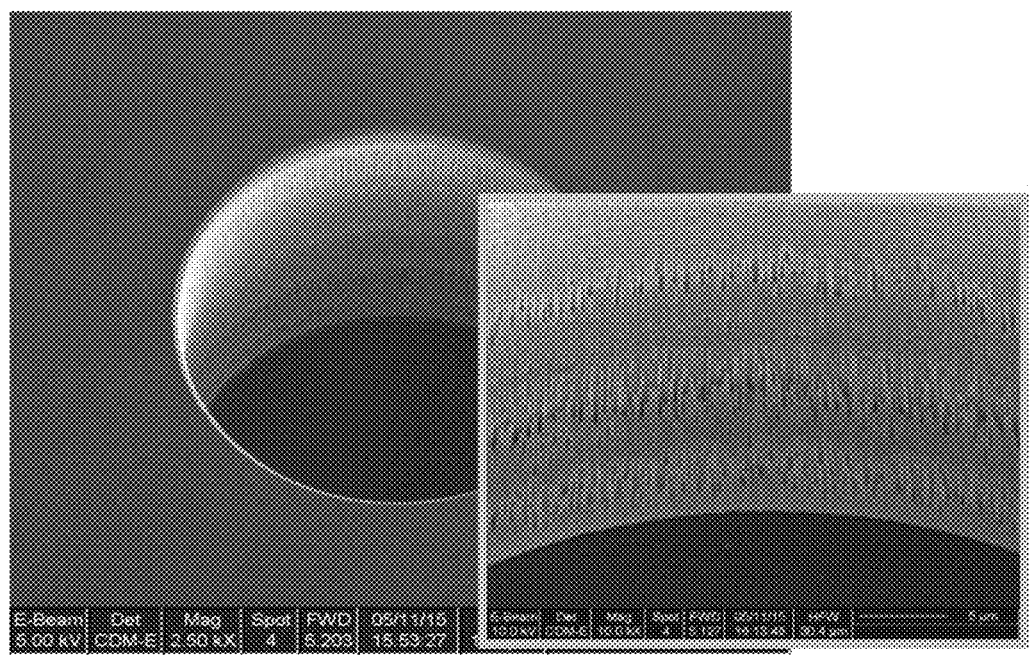
FIG. 3A illustrates two electron microscope images of a completed structure according to an embodiment.
Figure 3B:
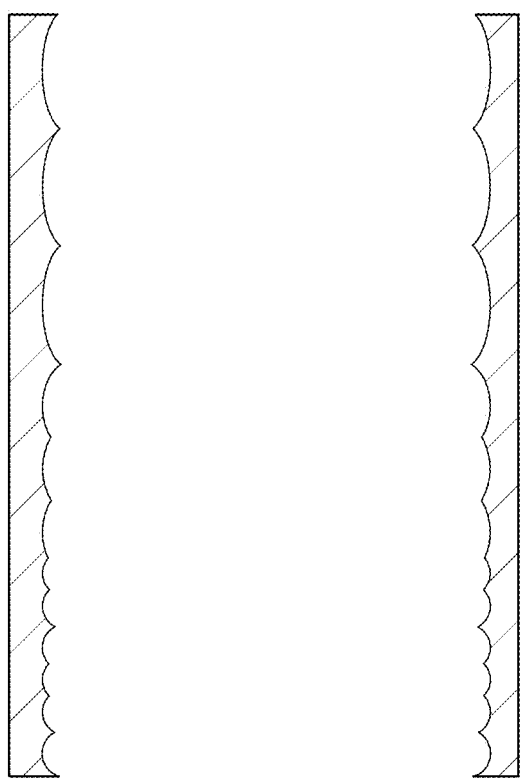
FIG. 3B illustrates a schematic cross-sectional view of the sidewall of the structure according to an embodiment.
Figure 3C:
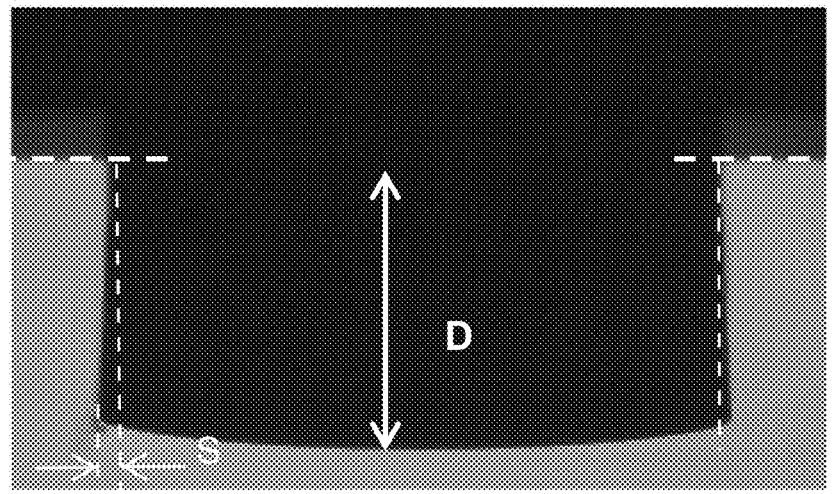
FIG. 3C illustrates an electron microscope image showing a cross-sectional view of the sidewall of the structure according to an embodiment.

FIG. 3A illustrates two electron microscope images of a completed structure fabricated according to an embodiment. The two images are obtained using an electron microscope in the case that the recessed portion is a circular hole. The image at the right side in FIG. 3A is an enlarged view showing the contour of the surface of the sidewall of the circular hole. As shown in the image, the surface of the sidewall is rough. FIG. 3B illustrates a schematic cross-sectional view of the sidewall of a hole in FIG. 3A. As can be seen in FIG. 3B, the sidewall contains a plurality of concaves which are scallop-shaped, and the sizes of the concaves decrease as the depth of the hole increases. Also, as can be seen in FIG. 3C, the sidewall is significantly inclined, that is, the angle between the sidewall and the bottom surface of the hole is usually less than 85 degrees and in some cases is around 82 degrees. In FIG. 3C, "D" denotes the vertical depth of the hole and "S" denotes the horizontal distance between the edge at the bottom of the sidewall and the edge at top of the sidewall. According to the embodiment, the ratio of S to D is within a range of 0.02 to 0.045. Therefore, according to the embodiment, as the recessed portion is etched deeper and deeper, the bottom surface of the recessed portion would be much larger than the opening of the recessed portion, i.e., the recessed portion would be undercut etched. This can be more substantial when the depth of the recessed portion is within a range of 200-300 μm and when the aspect ratio is within a range of 0.5-10. The above problems may be due to the repetition of the same isotropic etching steps.

Figure 3D:
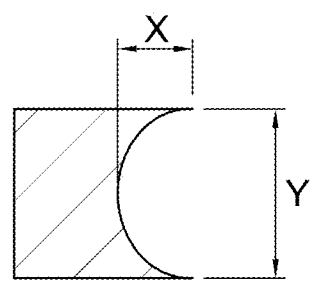
FIG. 3D illustrates a schematic cross-sectional view of a concave in the sidewall of the structure according to an embodiment.

FIG. 3D illustrates a schematic cross-sectional view of a concave in the sidewall of the structure according to an embodiment. It should be noted that FIG. 3D is not drawn to scale, but merely for ease of illustrating the shape and dimension of the concave. As shown in FIG. 3D, the concave is scallop-shaped, and the vertical dimension of the concave is denoted as "Y" and the horizontal dimension of the concave is denoted as "X." According to some embodiments, the ratio of the vertical dimension Y to the horizontal dimension X of the concave is within a range of 3 to 5 when the concave is in the top side of the sidewall of the recessed portion, the ratio of the vertical dimension Y to the horizontal dimension X of the concave is within a range of 2 to 4 when the concave is in the middle side of the sidewall of the recessed portion, and the ratio of the vertical dimension Y to the horizontal dimension X of the concave is within a range of 1 to 3. That is to say, according to the embodiments, the shapes and sizes of the scallop-shaped concaves are not uniform and are inconsistent along the sidewall of the recessed portion.

A recessed portion with such a rough and inclined sidewall which contains concaves with inconsistent sizes and shapes is not ideal enough in some applications. For example, if the recessed portion is a trench and an optical fiber is disposed in such a trench, the rough and inclined sidewall would affect the efficiency of signal transmission in the optical fiber.

The present disclosure provides for an improved structure with improved recessed portion having high aspect ratio, and a method of forming the same. The improved recessed portion has relatively uniform and consistent concaves in the sidewall and the sidewall is substantially perpendicular to the bottom surface of the recessed portion.

FIGS. 4A-4G each illustrate a cross-sectional view of a structure under fabrication through an improved method according to an embodiment of the present disclosure. FIG. 4H illustrates a cross-sectional view of a completed structure according to an embodiment of the present disclosure. It should be noted that these figures are not drawn to scale; instead, they are drawn for ease of illustration and explanation.

Figure 4A:
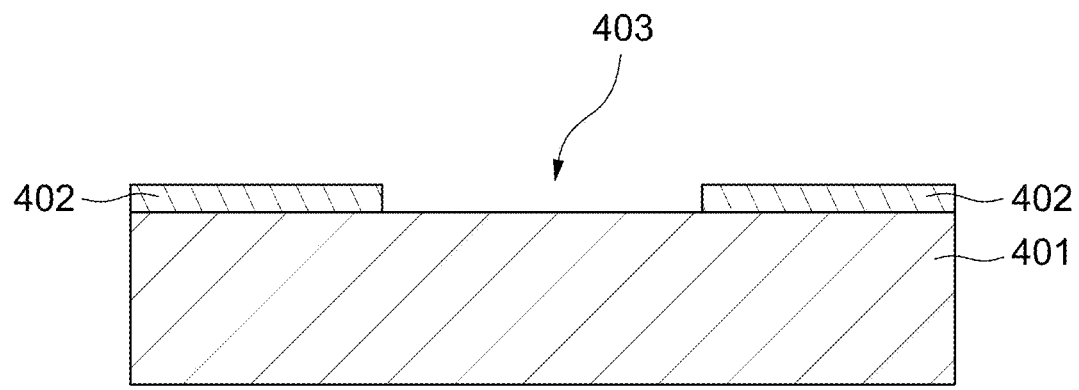
FIGS. 4A-4G each illustrate a cross-sectional view of a structure under fabrication according to an embodiment of the present disclosure.

In FIG. 4A, a semiconductor substrate 401 is provided. A mask 402 is formed, for example, by a photolithography technique, and which defines an opening so that a part of the semiconductor substrate 401 is exposed to form an exposed region 403. According to an embodiment of the present disclosure, the semiconductor substrate is a silicon substrate.

Figure 4B:
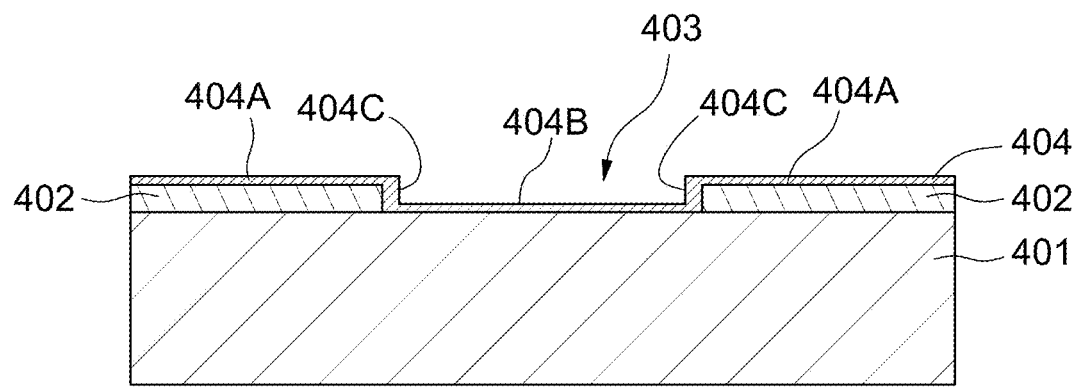

In FIG. 4B, a protection layer 404 is formed so as to cover every surface of the mask 402 and the exposed region 403. That is, there is a portion of the protection layer 404A formed on the top surface of the mask 402, a portion of the protection layer 404C formed on the at least one sidewall of the mask 402, and a portion of the protection layer 404B formed on the surface of exposed region 403. According to an embodiment of the present disclosure, the protection layer is polymeric and is formed using a passivation process which utilizes passivation gas comprising hexafluoropropene ($C_3F_6$) or octafluorocyclobutane ($C_4F_8$) or other suitable materials.

Figure 4C:
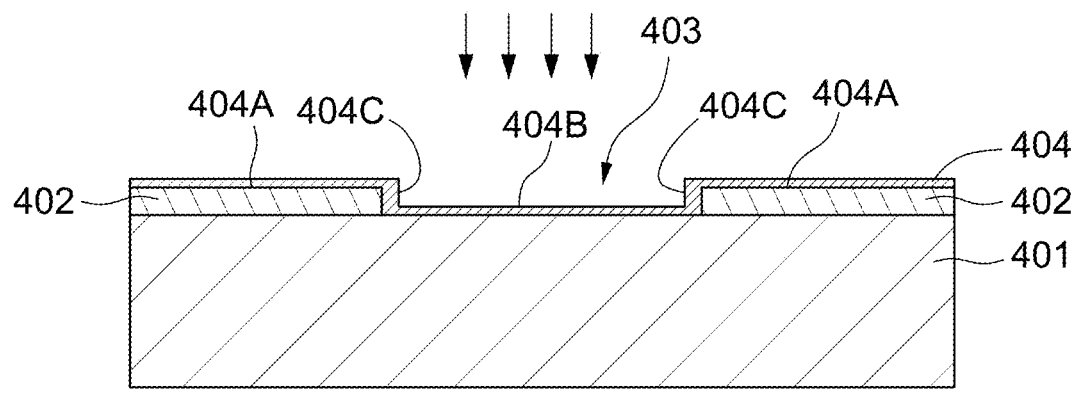
Figure 4D:
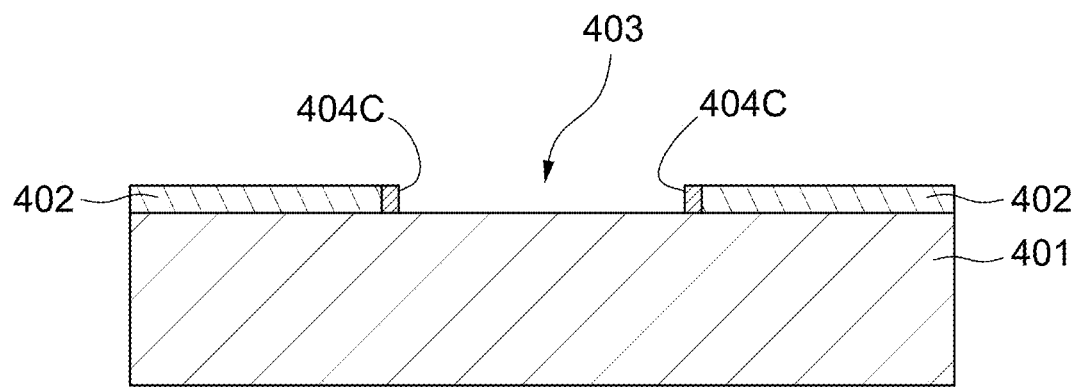

In FIG. 4C, a first etching process is performed. According to an embodiment of the present disclosure, dry-etch technique is used, and a sulfur fluoride such as sulfur hexafluoride ($SF_6$) is used as the etchant for the first etching process. Note that according to an embodiment of the present disclosure, in the first etching process, the driving energy used for driving the etchant applied in the first etching process is relatively high, and the etching is relatively anisotropic, and thus the etching direction is predominantly vertical, as shown in the direction of the arrows in FIG. 4C. The object of the first etching is to perform a vertical etch, so that it will vertically remove the portion of the protection layer 404A formed on the top surface of the mask 402 and remove the portion of the protection layer 404B formed on at least one surface, which includes the bottom surface, of the substrate exposed by the mask 402, while laterally maintaining the portion of the protection layer 404C formed on the at least one sidewall of the mask 402 (and, in the next cycle, laterally maintaining the portion of the protection layer formed on the at least one sidewall of the etched recessed portion 410 in the semiconductor substrate 401). As shown in FIG. 4D, the portion of the protection layer 404A and the portion of the protection layer 404B are removed, and the portion of the protection layer 404C remains.

Figure 4E:
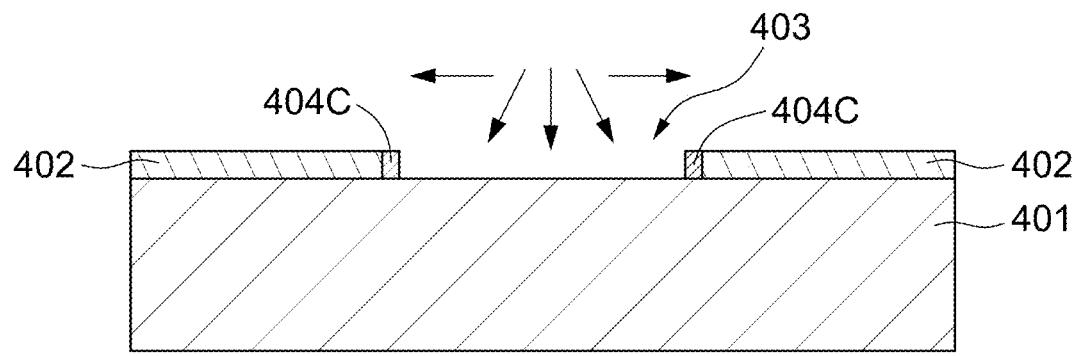
Figure 4F:
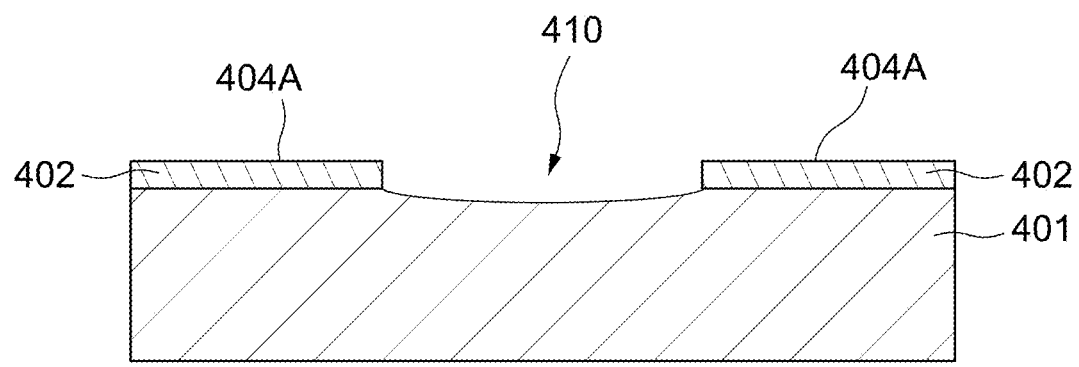
Figure 4G:
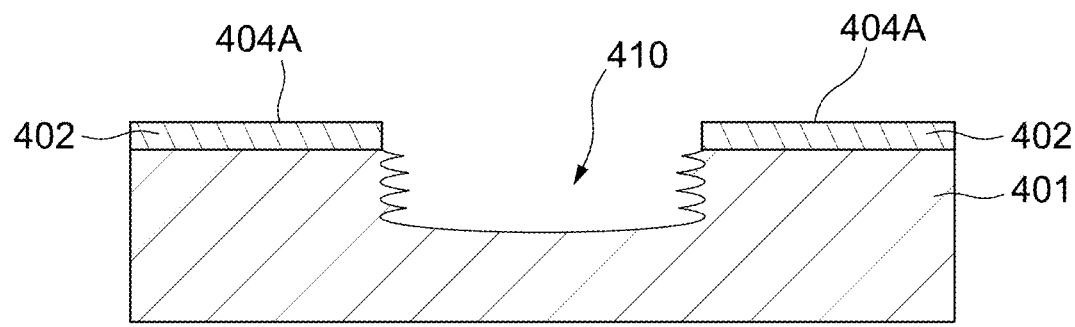
Figure 4H:
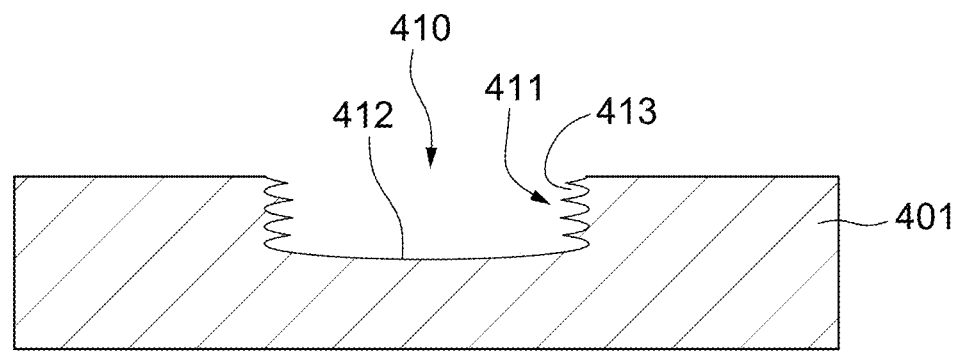
FIG. 4H illustrates a cross-sectional view of a completed structure according to an embodiment of the present disclosure.

In FIG. 4E, a second etching process is performed. According to an embodiment of the present disclosure, dry-etch technique is used, and a sulfur fluoride such as sulfur hexafluoride ($SF_6$) is used as the etchant for the second etching process. Note that according to an embodiment of the present disclosure, in the second etching process, the driving energy used for driving the etchant applied in the second etching process is relatively low, and the etching is relatively isotropic and the etching disperses in every direction, as shown in the directions of the arrows in FIG. 4E. The driving energy used in the second etching process is lower than the driving energy used in the first etching process, and the etching in the second etching process is more isotropic than that in the first etching process, or in other words, the first etching process is more anisotropic than the second etching process. The object of the second etching is to remove the remaining portions of the protection layer, which in this case is the portion of protection layer 404C on the at least one sidewall of the mask 402, and to etch the exposed portion of the substrate to form a recessed portion. In FIG. 4F, the remaining portion of the protection layer 404C is removed and the recessed portion 410 is formed. Note that as shown in FIGS. 4F and 4G, the sidewall of the mask 402 is relatively vertical, this is because the isotropic etching processes performed laterally etch the portion of the protection layer 404C formed on the sidewall of the mask 402, but do not overly etch the sidewall of the mask 402. Thus, the size of the opening of the mask can be remained unchanged and the recessed portion would not get wider and wider during the repeated etching processes.

In the next cycle, a protection layer is formed again so as to cover every surface of the mask and the recessed portion. That is, there is a portion of the protection layer formed on the top surface of the mask, a portion of the protection layer formed on the at least one sidewall of the mask, a portion of the protection layer formed on the bottom surface of the recessed portion, and also a portion of the protection layer formed on the at least one sidewall of the recessed portion. Then, the first etching process is again performed to remove the portion of the protection layer formed on the top surface of the mask and remove the portion of the protection layer formed on the at least one surface, which includes the bottom surface, of the recessed portion. And then, the second etching process is again performed to remove the remaining portions of the protection layer—i.e., the portion of the protection layer formed on the at least one sidewall of the mask and the portion of the protection layer formed on the at least one sidewall of the recessed portion—and also to etch the bottom of the recessed portion, so as to deepen the recessed portion.

Note that according to an embodiment of the present disclosure, the first driving energy used for driving the etchant applied in the first etching process is greater than a second driving energy used for driving the etchant applied in the second etching process. According to some embodiments of the present disclosure, the ratio of the first driving energy to the second driving energy is within a range from about 1.2 to about 8. By way of examples, the ratio of the first driving energy to the second driving energy may be 1.46, 2, 2.9, 3.2, 4.8, 6.45, or 7.3. According to an embodiment of the present disclosure, the first driving energy is about four times higher than the second driving energy. According to an embodiment of the present disclosure, the first driving energy is within a range of 60 Watts ±10%, i.e., 54-66 Watts, and the second driving energy is within a range of 15 Watts ±5%, i.e., 14.25-15.75 Watts.

Also, note that according to an embodiment of the present disclosure, the time for performing the first etching process is shorter than the time for performing the second etching process. According to an embodiment of the present disclosure, a ratio of the time for forming the protection layer to the time for performing the first etching process is within a range of 1.2 to 6, and a ratio of the time for forming the protection layer to the time for performing the second etching process is within a range of 0.2 to 1.8. Specifically, according to an embodiment of the present disclosure, a time for forming the protection layer is within a range of 2.3 seconds ±10%, a time for performing the first etching process is within a range of 2 seconds ±10%, and a time for performing the second etching process is within a range of 4 seconds ±10%.

By repeating the above-mentioned steps of forming a protection layer, performing the first etching process, and performing the second etching process as shown in FIGS. 4B-4E, the recessed portion 410 is getting deeper, as shown in FIG. 4G. According to an embodiment of the present disclosure, the above-mentioned steps of forming a protection layer, performing the first etching process, and performing the second etching process are repeated until a depth of the recessed portion is within a range of 160 μm to 400 μm. As shown in FIG. 4H, after removing the mask 402, the completed recessed portion 410 is obtained and the fabricating process is complete.

As can be seen in FIG. 4H, the at least one sidewall 411 of the completed recessed portion 410 contains a plurality concaves which are scallop-shaped. Note that compared to the recessed portion according to an embodiment as shown in FIGS. 3A-3D, in an embodiment of the present disclosure, the scallop-shaped concaves 413 are more uniform and consistent in size and shape, and the at least one sidewall 411 is more perpendicular to the bottom surface 412. This is due to the alternating use of the first etching process and the second etching process. By the repeated and alternating use of the first etching process and the second etching process, the recessed portion can be deepened straight downward without unnecessarily laterally etching the sidewall of the recessed portion, since the sidewall of the recessed portion is always protected by the protection layer from being etched during the first and second etching processes.

It should be noted that while FIGS. 4A-4H show the cross-sectional views, the type of the recessed portion can be determined by the shape of the opening of the mask. For example, if the opening of the mask is in a rectangular shape, then the recessed portion would be a trench. On the other hand, if the opening of the mask is in a circular shape, then the recessed portion would be a circular hole. According to an embodiment of the present disclosure, in the case that the recessed portion is a trench, the aspect ratio of the recessed portion is in a range of 0.1 to 15. According to an embodiment of the present disclosure, in the case that the recessed portion is a hole, the aspect ratio of the recessed portion is in a range of 0.3 to 26.

Figure 5A:
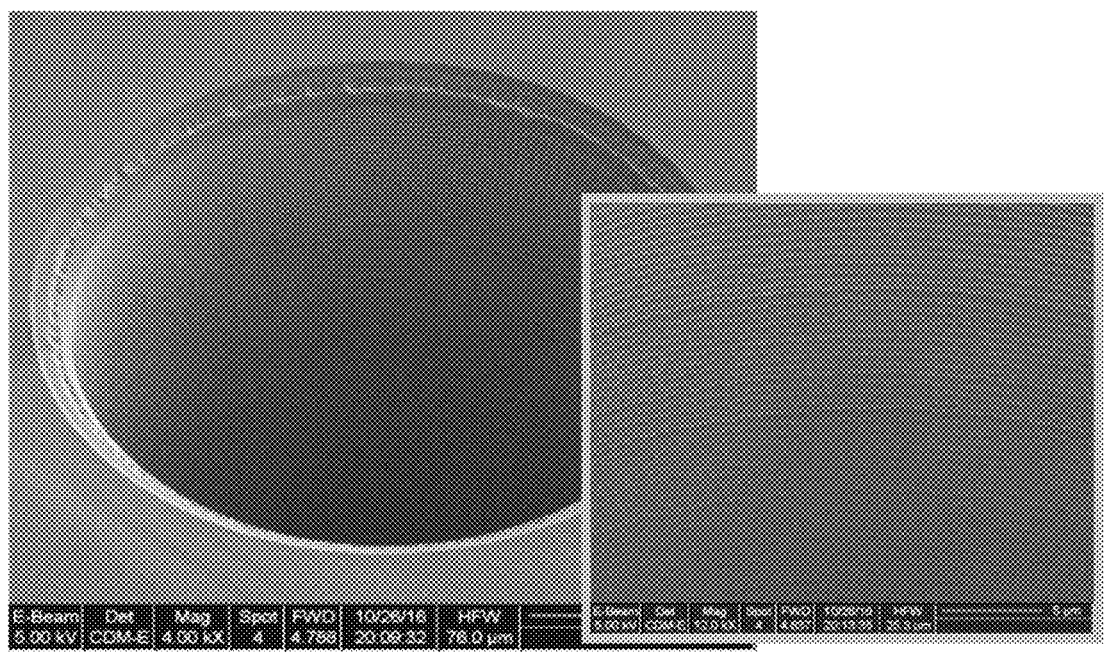
FIG. 5A illustrates two electron microscope images of a completed structure according to an embodiment of the present disclosure.
Figure 5B:
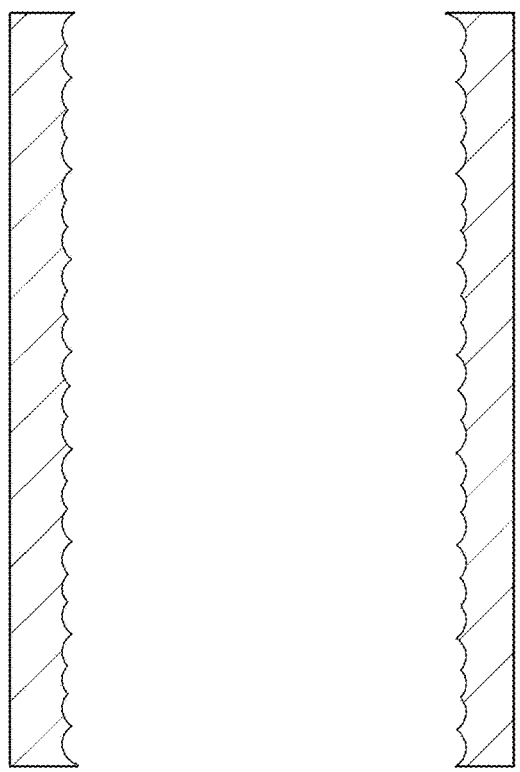
FIG. 5B illustrates a schematic cross-sectional view of the sidewall of the structure according to an embodiment of the present disclosure.
Figure 5C:
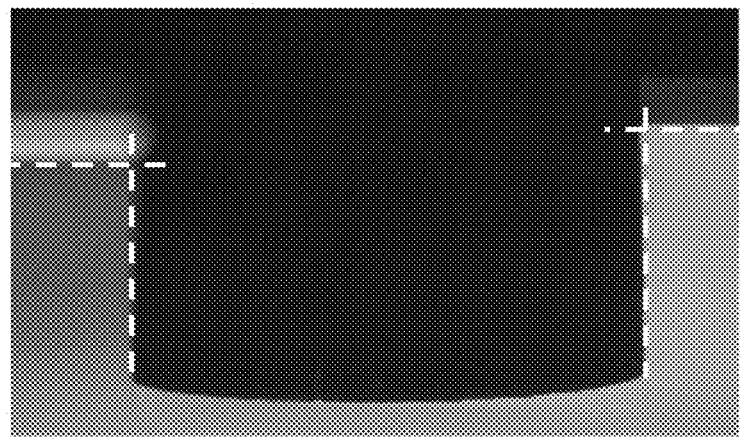
FIG. 5C illustrates an electron microscope image showing a cross-sectional view of the sidewall of the structure according to an embodiment of the present disclosure.

FIG. 5A illustrates two electron microscope images of a completed structure according to an embodiment of the present disclosure. FIG. 5A shows two images obtained using an electron microscope in the case that the recessed portion is a circular hole. The image at the right side in FIG. 5A is an enlarged view showing the contour of the surface of the sidewall of the circular hole. FIG. 5B illustrates a schematic cross-sectional view of the sidewall of hole in FIG. 5A. As can be seen in FIG. 5B, the sidewall of the circular hole contains a plurality of concaves which are scallop-shaped, and the sizes of the concaves remains similar along the entire sidewall. Also, as can be seen in FIG. 5C, the sidewall is substantially perpendicular to the bottom surface of the hole. According to an embodiment of the present disclosure, the angle between the sidewall and the bottom surface is about 88 degrees to about 90 degrees.

Figure 5D:
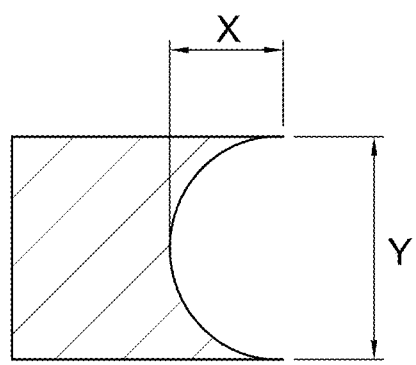
FIG. 5D illustrates a schematic cross-sectional view of a concave in the sidewall of the structure according to an embodiment of the present disclosure.

FIG. 5D illustrates a schematic cross-sectional view of a concave in the sidewall of the structure according to an embodiment of the present disclosure. It should be noted that FIG. 5D is not drawn to scale, but merely for ease of illustrating the shape and dimension of the concave. As shown in FIG. 5D, the concave is scallop-shaped, and the vertical dimension of the concave is denoted as "Y" and the horizontal dimension of the concave is denoted as "X." According to an embodiment of the present disclosure, the ratio of the vertical dimension Y to the horizontal dimension X of the concave is within a range of 3 to 5, whether or not the concave is located in the top, middle, or bottom side of the sidewall of the recessed portion. That is to say, according to the present disclosure, the shapes and sizes of the scallop-shaped concaves are nearly uniform or consistent throughout the entire sidewall of the recessed portion.

The improved structure and the improved method according to the present disclosure are advantageous in many aspects. For example, the improved method realizes a higher rate of etching the semiconductor substrate to form a recessed portion; that is, the method realizes higher UPH (units per hour) for etching. In some other embodiments, the isotropic etching is used to etch the protection layer on the recessed portion and also to continuously etch the exposed semiconductor at the bottom of the recessed portion. By contrast, in an embodiment according to the present disclosure, since the protection layer on the bottom surface of the recessed portion is quickly removed by the anisotropic first etching process (higher-energy and shorter-time etching), the isotropic second etching (lower-energy and longer-time etching) can be used to etch more of the exposed semiconductor at the bottom of the recessed portion. Thus, the higher etching rate (higher UPH) can be realized. Furthermore, compared to the recessed portion in some other embodiments, the sidewall of the recessed portion in an embodiment of the present disclosure is more smooth and uniform, that is to say, the scallop-shaped concaves in the sidewall are smaller and are more consistent in shape and size throughout the sidewall, which leads to better efficiency of light transmission when the recessed portion is used as a trench to accommodate an optical fiber. Moreover, compared to the recessed portion in some other embodiments, the sidewall of the recessed portion in the present disclosure is more vertical; that is, the sidewall is more perpendicular to the bottom surface of the recessed portion, which also leads to better efficiency of signal transmission when the recessed portion is used as a trench to accommodate an optical fiber.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical electronic device, comprising:
   a first die; and
   a second die stacked on the first die, wherein a portion of a surface of the second die is exposed from the first die, the second die includes a trench recessed from the surface, and the trench includes at least one sidewall and a bottom surface, wherein the at least one sidewall comprises a profile including a plurality of concaves, and the concaves have substantially uniform shapes along the at least one sidewall, wherein an aspect ratio of the trench is within a range of 0.1-26.

2. The optical electronic device of claim 1, wherein a portion of an edge of the first die is exposed to the trench of the second die.

3. The optical electronic device of claim 1, wherein the trench of the second die is configured to dispose an optical fiber.

4. The optical electronic device of claim 1, wherein an included angle between the at least one sidewall and the bottom surface is about 88 degrees to about 90 degrees.

5. The optical electronic device of claim 1, wherein the plurality of concaves each includes a scallop-shaped concave.

6. The optical electronic device of claim 5, wherein each of the scallop-shaped concaves includes a horizontal dimension and a vertical dimension, and wherein a ratio of the vertical dimension to the horizontal dimension is within a range of 3 to 5.

7. An optical electronic device, comprising:
   a first die; and
   a second die stacked on the first die, wherein a portion of a surface of the second die is exposed from the first die, the second die includes a trench recessed from the surface, and the trench includes at least one sidewall and a bottom surface, wherein the at least one sidewall comprises a profile including a plurality of concaves, and the concaves have substantially uniform shapes along the at least one sidewall, wherein the plurality of concaves each includes a scallop-shaped concave, and wherein each of the scallop-shaped concaves includes a horizontal dimension and a vertical dimension, and wherein a ratio of the vertical dimension to the horizontal dimension is within a range of 3 to 5.

8. The optical electronic device of claim 7, wherein an included angle between the at least one sidewall and the bottom surface is about 88 degrees to about 90 degrees.

* * * * *